US008988135B2

(12) United States Patent
Kim et al.

(10) Patent No.: US 8,988,135 B2
(45) Date of Patent: Mar. 24, 2015

(54) SEMICONDUCTOR DEVICE AND BODY BIAS METHOD THEREOF

(71) Applicants: Kwangho Kim, Osan-si (KR); JinHyuk Jeung, Yongin-si (KR); HyungJong Ko, Seongnam-si (KR); HoSung Roh, Suwon-si (KR); Hojin Park, Suwon-si (KR); Sun-kyu Lee, Daejeon (KR)

(72) Inventors: Kwangho Kim, Osan-si (KR); JinHyuk Jeung, Yongin-si (KR); HyungJong Ko, Seongnam-si (KR); HoSung Roh, Suwon-si (KR); Hojin Park, Suwon-si (KR); Sun-kyu Lee, Daejeon (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 14/092,318

(22) Filed: Nov. 27, 2013

(65) Prior Publication Data

US 2014/0159806 A1 Jun. 12, 2014

(30) Foreign Application Priority Data

Dec. 10, 2012 (KR) ........................ 10-2012-0142892

(51) Int. Cl.
*H01L 35/00* (2006.01)
*G05F 3/02* (2006.01)
*G05F 3/20* (2006.01)

(52) U.S. Cl.
CPC . *G05F 3/02* (2013.01); *G05F 3/205* (2013.01)
USPC .......................................................... 327/513

(58) Field of Classification Search
USPC ................................. 327/512, 513, 530, 534
See application file for complete search history.

(56) References Cited

U.S. PATENT DOCUMENTS

| | | | |
|---|---|---|---|
| 6,484,265 B2 * | 11/2002 | Borkar et al. | 713/324 |
| 6,529,421 B1 * | 3/2003 | Marr et al. | 365/189.09 |
| 6,753,719 B2 * | 6/2004 | Bhagavatheeswaran et al. | 327/534 |
| 6,957,163 B2 | 10/2005 | Ando | |
| 7,009,904 B2 | 3/2006 | Kim | |
| 7,106,128 B2 * | 9/2006 | Tschanz et al. | 327/534 |
| 7,366,048 B2 | 4/2008 | Byeon | |
| 7,616,048 B2 | 11/2009 | Choi et al. | |
| 8,018,780 B2 | 9/2011 | Houston et al. | |
| 8,181,147 B2 | 5/2012 | Tang et al. | |
| 8,742,831 B2 * | 6/2014 | Fechner | 327/534 |
| 2002/0029352 A1 | 3/2002 | Borkar et al. | |
| 2004/0111231 A1 | 6/2004 | Ando | |
| 2005/0104566 A1 | 5/2005 | Kim | |
| 2007/0002640 A1 | 1/2007 | Byeon | |
| 2008/0054989 A1 | 3/2008 | Choi et al. | |
| 2008/0175068 A1 | 7/2008 | Houston et al. | |
| 2010/0333057 A1 | 12/2010 | Tang et al. | |

FOREIGN PATENT DOCUMENTS

| | | |
|---|---|---|
| KR | 10-2007-0025000 A | 3/2007 |
| KR | 10-0922885 B1 | 10/2009 |

* cited by examiner

*Primary Examiner* — Jeffrey Zweizig
(74) *Attorney, Agent, or Firm* — Sughrue Mion, PLLC

(57) ABSTRACT

Exemplary embodiments disclose a semiconductor device which includes a function block including a plurality of transistors; a temperature detector configured to detect a driving temperature of the function block in real time; and an adaptive body bias generator configured to provide a body bias voltage to adaptively adjust leakage currents of the transistors according to the detected driving temperature, wherein the adaptive body bias generator is further configured to generate a body bias voltage corresponding to a predetermined minimum leakage current according to the driving temperature.

27 Claims, 11 Drawing Sheets

| Process Class | | Constants of Function | | | |
|---|---|---|---|---|---|
| | | NMOS TR | | PMOS TR | |
| NMOS TR | PMOS TR | a | b | a | b |
| S | S | -a1 | -b1 | a1 | b1 |
| S | F | -a2 | -b3 | a2 | b3 |
| N | N | -a3 | -b2 | a3 | b2 |
| F | S | -a4 | -b1 | a4 | b1 |
| F | F | -a5 | -b3 | a5 | b3 |

(b1<b2<b3)

| Temperature | Body Bias | Leakage Current (PMOS TR) | Leakage Percentage |
|---|---|---|---|
| 25℃ (Test) | Default(1.1V) | 0.297 nA | 100% |
| | 1.3V | 0.247 nA | 83.2% |
| | 1.6V | 0.505 nA | 170% |
| 85℃ (Chip Working) | Default(1.1V) | 2.53 nA | 100% |
| | 1.3V | 1.42 nA | 56% |
| | 1.6V (Detected by Temp.sensing) | 1.11 nA | 44% |

SEMICONDUCTOR DEVICE AND BODY BIAS METHOD THEREOF

CROSS-REFERENCE TO RELATED APPLICATIONS

This application claims priority from Korean Patent Application No. 10-2012-0142892 filed Dec. 10, 2012, in the Korean Intellectual Property Office, the entire disclosure of which is hereby incorporated by reference.

BACKGROUND

Exemplary embodiments relate to a semiconductor device. More particularly, exemplary embodiments relate to a semiconductor device capable of adjusting a body bias according to a temperature, and a body bias method thereof.

In recent years, the use of mobile devices, such as a smart phone, a tablet PC, a digital camera, an MP3 player, a PDA, etc., has increased. As multimedia driving and throughput of data are increased, a high-speed processor may be used in a mobile device. The mobile device may include semiconductor devices (e.g., a working memory (e.g., DRAM), a non-volatile memory, an application processor, etc.) to drive various application programs. As high performance is required under a mobile environment, the degree of integration and a driving frequency of the semiconductor devices may become higher.

In the mobile device of the related art, controlling leakage current may be very important in order to reduce power consumption, and control temperature. Therefore, a semiconductor device in the related art may be scaled down for high integration and high performance. However, scaling down of the semiconductor device in the related art may cause an increase in a leakage current of the semiconductor device. Thus, a technique of controlling a leakage current of the semiconductor device is needed.

SUMMARY

An aspect of an exemplary embodiment may provide a semiconductor device which includes a function block including a plurality of transistors; a temperature detector configured to detect a driving temperature of the function block in real time; and an adaptive body bias generator configured to provide a body bias voltage to adaptively adjust leakage currents of the transistors according to the detected driving temperature, wherein the adaptive body bias generator is further configured to generate the body bias voltage corresponding to a predetermined minimum leakage current according to the driving temperature.

Another aspect of an exemplary embodiment may provide a body bias method of a semiconductor device which includes detecting a driving temperature of the semiconductor device; generating a body bias voltage for adjusting leakage currents of a plurality of transistors included in the semiconductor device at the driving temperature; and providing the body bias voltage to the transistors of the semiconductor device.

Another aspect of an exemplary embodiment may provide a system on chip comprising a plurality of function blocks; a temperature detector configured to detect a respective driving temperature of each of the function blocks in real time; and a body bias generator configured to generate a respective body bias voltage to adaptively adjust leakage currents of each of the function blocks according to the respective driving temperature.

Still another aspect of an exemplary embodiment may provide a function block including: at least one NMOS transistor configured to receive a NMOS bias voltage from an adaptive body bias generator; at least one PMOS transistor configured to receive a PMOS bias voltage from the adaptive body bias generator; and a temperature detector configured to detect a driving temperature of the function block in real time and provide the detected driving temperature to the adaptive body bias generator.

BRIEF DESCRIPTION OF THE DRAWINGS

The above and other aspects and features of the exemplary embodiments will become apparent from the following description with reference to the following figures, wherein like reference numerals refer to like parts throughout the various figures unless otherwise specified, and wherein

FIG. 3A is a cross-sectional view of a PMOS transistor;

FIG. 3B is a cross-sectional view of an NMOS transistor;

DETAILED DESCRIPTION OF THE EXEMPLARY EMBODIMENTS

Figure 1:
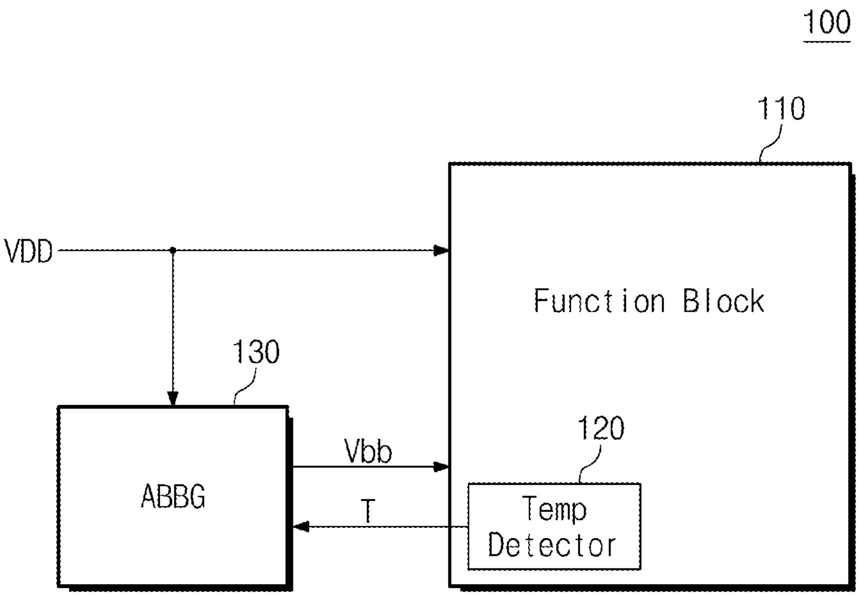
FIG. 1 is a block diagram schematically illustrating a semiconductor device according to an embodiment.

Embodiments will be described in detail with reference to the accompanying drawings. The exemplary embodiments, however, may be embodied in various different forms, and should not be construed as being limited only to the illustrated embodiments. Rather, these embodiments are provided as examples so that this disclosure will be thorough and complete, and will fully convey the concept of the exemplary embodiments to those skilled in the art. Accordingly, known processes, elements, and techniques are not described with respect to some of the embodiments of the exemplary embodiments. Unless otherwise noted, like reference numerals denote like elements throughout the attached drawings and written description, and thus descriptions will not be repeated. In the drawings, the sizes and relative sizes of layers and regions may be exaggerated for clarity.

It will be understood that, although the terms “first”, “second”, “third”, etc., may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the exemplary embodiments.

Spatially relative terms, such as “beneath”, “below”, “lower”, “under”, “above”, “upper”, etc., may be used herein for ease of description to describe one element or feature’s relationship to another element(s) or feature(s), as illustrated in the figures. It will be understood that the spatially relative terms are intended to encompass different orientations of the device in use or operation in addition to the orientation depicted in the figures. For example, if the device in the figures is turned over, elements described as “below” or “beneath” or “under” other elements or features would then be oriented “above” the other elements or features. Thus, the exemplary terms “below” and “under” can encompass both an orientation of above and below. The device may be otherwise oriented (rotated 90 degrees or at other orientations), and the spatially relative descriptors used herein interpreted accordingly. In addition, it will also be understood that when a layer is referred to as being “between” two layers, it can be the only layer between the two layers, or one or more intervening layers may also be present.

The terminology used herein is for the purpose of describing particular embodiments only and is not intended to be limiting of the exemplary embodiments. As used herein, the singular forms “a”, “an”, and “the” are intended to include the plural forms as well, unless the context clearly indicates otherwise. It will be further understood that the terms “comprises” and/or “comprising,” when used in this specification, specify the presence of stated features, integers, steps, operations, elements, and/or components, but do not preclude the presence or addition of one or more other features, integers, steps, operations, elements, components, and/or groups thereof. As used herein, the term “and/or” includes any and all combinations of one or more of the associated listed items. Also, the term “exemplary” is intended to refer to an example or illustration.

It will be understood that when an element or layer is referred to as being “on”, “connected to”, “coupled to”, or “adjacent to” another element or layer, it can be directly on, connected, coupled, or adjacent to the other element or layer, or intervening elements or layers may be present. In contrast, when an element is referred to as being “directly on,” “directly connected to”, “directly coupled to”, or “immediately adjacent to” another element or layer, there are no intervening elements or layers present.

Unless otherwise defined, all terms (including technical and scientific terms) used herein have the same meaning as commonly understood by one of ordinary skill in the art to which the exemplary embodiments belong. It will be further understood that terms, such as those defined in commonly used dictionaries, should be interpreted as having a meaning that is consistent with their meaning in the context of the relevant art and/or the present specification, and will not be interpreted in an idealized or overly formal sense unless expressly so defined herein.

FIG. 1 is a block diagram schematically illustrating a semiconductor device according to an embodiment.

Referring to FIG. 1, a semiconductor device 100 may include a function block 110, a temperature detector 120, and an adaptive body bias generator (ABBG) 130. The semiconductor device 100 may adjust leakage currents of transistors of the function block 110 by adjusting a body bias according to a temperature using the adaptive body bias generator 130.

The function block 110 may be a set of circuits which perform a variety of operations according to data or a control signal provided to the semiconductor device 100. The function block 110 may include a variety of circuits to perform an overall function of the semiconductor device 100. The minimum logic unit constituting the function block 110 may be a transistor. For example, a transistor included in the function block 110 may be a PMOS transistor or an NMOS transistor.

The function block 110 may be provided with a body bias voltage Vbb from the adaptive body bias generator 130. NMOS or PMOS transistors of the function block 110 may be provided with the body bias voltage Vbb, which is varied according to a temperature. Thus, leakage currents of the PMOS or NMOS transistors sensitive to a temperature may be effectively controlled.

The temperature detector 120 may detect an internal temperature of the semiconductor device 100. As a result of the detection, the temperature detector 120 may provide temperature information T to the adaptive body bias generator 130. The temperature detector 120 may use a thermo electromotive force (or, thermoelectric couple) sensor which senses an electromotive force varied according to a temperature, a pyro conductivity sensor to sense a resistance value varied according to a temperature, etc. The temperature detector 120 may use of a band-gap reference type semiconductor sensor, which is formed using a current mirror type of semiconductor sensor and a diode. However, the exemplary embodiments are not limited thereto.

The adaptive body bias generator 130 may provide the body bias voltage Vbb to the function block 110. The adaptive body bias generator 130 may generate the body bias voltage Vbb based on a real-time temperature T from the temperature detector 120. A leakage current of a transistor, formed of semiconductor, may be very sensitive to a temperature. At a test process, a body bias voltage may be fixed to a predetermined value. Thus, the body bias voltage may be provided, regardless of a mounting environment where the semiconductor device 100 is driven.

The adaptive body bias generator 130 of the exemplary embodiments may generate a body bias voltage optimized to a temperature. The adaptive body bias generator 130 of the exemplary embodiments may generate the body bias voltage, such that a leakage current is minimized under a detected temperature. Alternatively, the adaptive body bias generator 130 of the exemplary embodiments may provide an approximate value of the body bias voltage for securing a minimum leakage current under a detected temperature. With an embodiment, leakage currents of transistors of the function block 110 may be stably controlled, even during rapid variation in a driving temperature.

Basic components of the semiconductor device 100, according to the exemplary embodiments, are described. However, it is well understood that the semiconductor device 100 further comprises various components, which are connected with the above-described components. Here, the semiconductor device 100 may be formed of a system on chip (Soc) including a plurality of function blocks (hereinafter, referred to as intellectual properties (IPs)). The semiconductor device 100 may be a part of the system on chip, or correspond to one of a plurality of IPs.

The semiconductor device 100 of the exemplary embodiments may generate the body bias voltage Vbb for optimizing the amount of leakage current, according to a variation in a driving temperature. The amount of leakage current flowing to a transistor may be minimized by providing the body bias voltage Vbb, which is optimized at a current driving temperature T. The amount of leakage current of the semiconductor device 100 may increase when the semiconductor device 100 is scaled down. A leakage current of the semiconductor device 100 may be very sensitive to a temperature. Thus, a phenomenon (e.g., thermal positive feedback) in which an increase in a temperature and an increase in a leakage current may lower semiconductor device performance. With an embodiment, a chain reaction may be prevented such that an increase in the leakage current due to an increase in a temperature does not occur.

Figure 2:
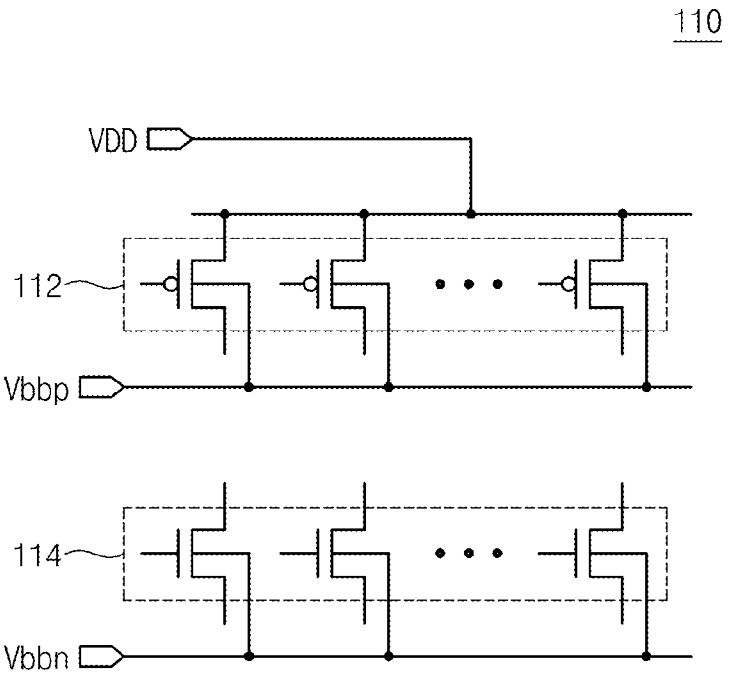
FIG. 2 is a circuit diagram schematically illustrating transistors in a function block of FIG. 1.

FIG. 2 is a circuit diagram schematically illustrating transistors in a function block of FIG. 1.

Referring to FIG. 2, a function block 110 may include a plurality of PMOS transistors 112 and a plurality of NMOS transistors 114. Although not show in FIG. 2, it is well understood that the function block 110 further comprises various components, apart from transistors.

The PMOS transistors 112 may include a part or all of PMOS transistors included in the function block 110. A driving voltage VDD may be provided to sources of some of the PMOS transistors 112. Sources of some other PMOS transistors may be connected with a drain or source of a PMOS or NMOS transistor included in the function block 110. Drains of the PMOS transistors may be grounded or connected to a drain or source of a PMOS or NMOS transistor included in the function block 110. A PMOS body bias voltage Vbbp from an adaptive body bias generator 130 may be provided to bodies of the PMOS transistors 112 included in the function block 110.

The NMOS transistors 114 may include a part or all of NMOS transistors included in the function block 110. Drains of some of the NMOS transistors 114 may be connected to a drain or source of a PMOS or NMOS transistor included in the function block 110. Sources of the NMOS transistors 114 may be grounded or connected with a drain or source of a PMOS or NMOS transistor included in the function block 110. Drains of the PMOS transistors may be grounded or connected to a drain or source of a PMOS or NMOS transistor included in the function block 110. An NMOS body bias voltage Vbbn from the adaptive body bias generator 130 may be provided to bodies of the NMOS transistors 112 included in the function block 110.

Basic transistor elements constituting a function block are described. However, elements supplied with a body bias voltage of the exemplary embodiments may not be limited to illustrated transistors. Body bias voltages Vbbp and Vbbn of the exemplary embodiments can be provided to stably control operating characteristics, which are varied according to a variation in a temperature.

Figure 3A:
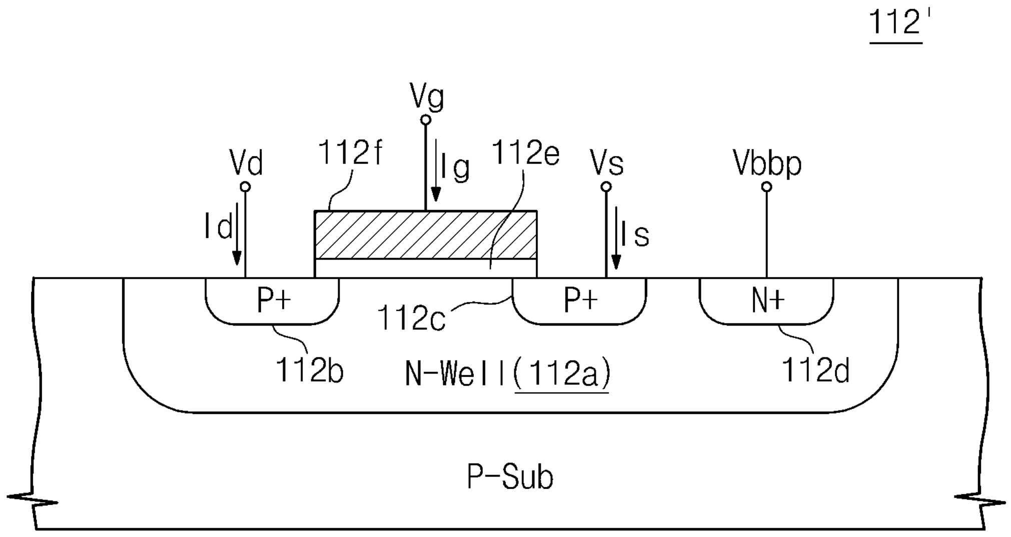
FIGS. 3A and 3B are cross-sectional views of PMOS and NMOS transistors of FIG. 2.
Figure 3B:
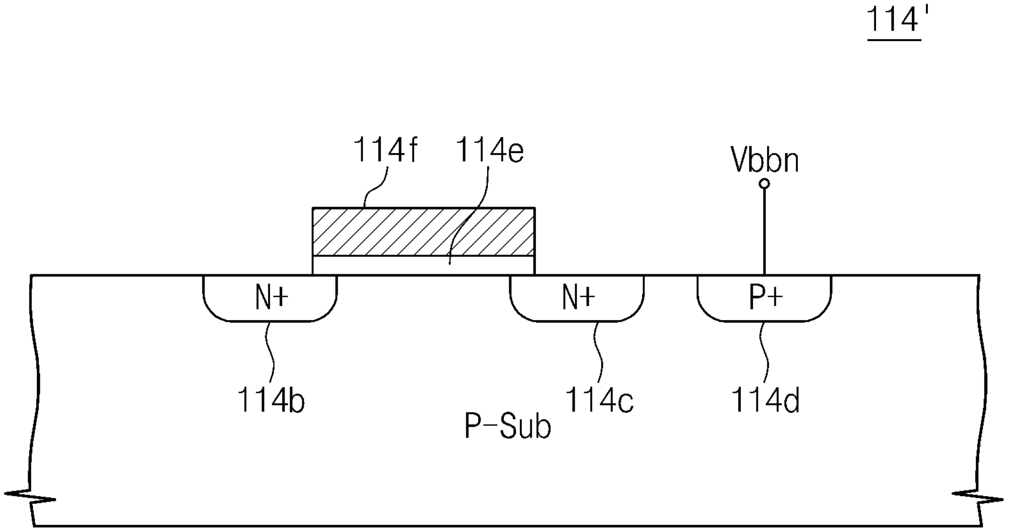

FIGS. 3A and 3B are cross-sectional views of PMOS and NMOS transistors of FIG. 2. FIG. 3A is a cross-sectional view of a PMOS transistor 112', and FIG. 3B is a cross-sectional view of an NMOS transistor 114'.

Referring to FIG. 3A, an N-well **112*a* may be formed at a p-type substrate P-Sub to form a PMOS transistor 112'. The N-well 112*a* may be formed by implanting an N-type dopant to the p-type substrate P-Sub. P+ doping regions 112*b* forming a source and a drain of a PMOS transistor and 112*c* may be formed at the N-well 112*a*. An N+ doping region 112*d* for providing a PMOS body bias voltage Vbbp may be formed at the N-well 112*a*. A gate insulation film 112*e* and a gate electrode 112*f* may be sequentially stacked. The gate insulation film 112*e* may be formed of an oxide film, a nitride film, or a stacked structure thereof. Also, the gate insulation film 112*e* may be formed of a metallic oxide film having high dielectric constant, a laminated stack structure thereof, or a mixing film thereof. The gate electrode 112*f*** may be formed of impurity (P, As, B, etc.) doped poly silicon film or a metal film.

It is assumed that a gate voltage Vg is applied to the gate electrode **112*f* of the PMOS transistor 112' and drain and source voltages Vd and Vs are applied to the P+ doping regions 112*b* and 112*c*. Also, a PMOS body bias voltage Vbbp may be applied to the N+ doping region 112*d* as a body electrode of the PMOS transistor 112'. Here, the gate voltage Vg applied to the gate electrode may have a voltage level (e.g., VDD) sufficient to turn off the PMOS transistor 112'**. The source voltage Vs applied to the source electrode may be a driving voltage VDD and the drain voltage Vd applied to the drain electrode may be a ground voltage VSS.

A current flowing to a drain terminal when the voltages Vg, Vd, Vs, and Vbbp are applied to corresponding electrodes may be referred to as a static leakage current IDS. The static leakage current IDS may be influenced by a bias state of the PMOS transistor 112'. In particular, the static leakage current IDS may be sensitive to a temperature. In the event that a driving frequency of the semiconductor device 100 increases, a driving temperature of the semiconductor device 100 may rise. An increase in the static leakage current IDS according to a temperature may be relatively sharp.

Referring to FIG. 3B, N+ doping regions **114*b* and 114*c* forming a drain terminal and a source terminal may be formed at a P-type substrate P-Sub to form an NMOS transistor 114'. A P+ doping region 114*d* for providing a body bias voltage Vbbn may be provided at the P-type substrate P-Sub. A gate insulation film 114*e* and a gate electrode 114*f* may be sequentially formed. If a body bias voltage Vbbn being a negative voltage is provided, a reverse bias may be formed between the N+ doping regions 114*b* and 114*c* and the P-type substrate P-Sub. In this case, a leakage current flowing between a source and a drain of the NMOS transistor 114' formed of the N+ doping regions 114*b* and 114*c*** may be reduced.

Figure 4:
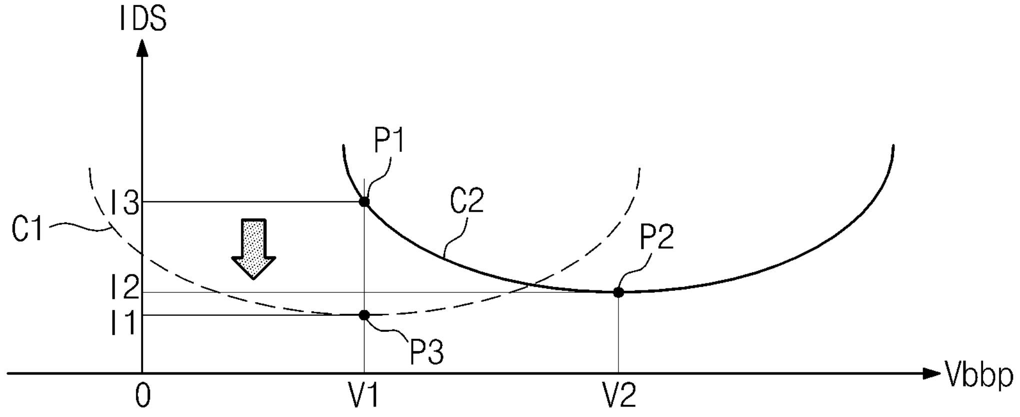
FIG. 4 is a graph illustrating a characteristic of a body bias voltage according to an embodiment.

FIG. 4 is a graph illustrating a characteristic of a body bias voltage according to an embodiment. Referring to FIG. 4, an adaptive body bias generator 130 (refer to FIG. 1) of the exemplary embodiments may vary a body bias voltage according to a driving temperature. The adaptive body bias generator 130 of the exemplary embodiments may minimize a leakage current of a semiconductor device, driven at various temperatures, by adjusting a body bias voltage according to a temperature.

A curve C1 may show a characteristic of a leakage current of a PMOS transistor at 25° C. A level of a leakage current IDS of the PMOS transistor at 25° C. may be exponentially varied according to a PMOS body bias voltage Vbbp. Thus, a voltage V1, where a leakage current I1 generated at 25° C. is lowest, may be used as a basic body bias voltage.

However, there may be a number of examples where a semiconductor device 100 is driven at a higher temperature. In the event that a temperature of the semiconductor device 100 is driven at a high speed, it may rise up to 80° C. A curve C2 may show a variation in a level of leakage current according to a body bias voltage of a PMOS transistor at 85° C. A level of leakage current of a PMOS transistor at 85° C. may be different from that at 25° C. However, under the same body bias voltage V1, there may flow a relatively large leakage current I3 at 85° C. A point P1 may show this characteristic. However, under the body bias voltage V1, there may flow a minimum leakage current I1 at 25° C. A point P3 may show this characteristic. If the body bias voltage V1 is fixed at a variation in a temperature, a large leakage current may flow according to an increase in a temperature.

On the other hand, if a body bias voltage V2 allowing the smallest leakage current I2 is provided, an increase in a leakage current may be slight at 85° C. According to an embodiment, a body bias voltage Vbbp allowing a minimum leakage current may be provided at various temperatures at which the semiconductor device 100 is driven. Body voltages of transistors in a function block 110 may be varied according to real-time temperature information provided from a temperature sensor 120 (refer to FIG. 1). Thus, with an embodiment, it is possible to prevent power consumption or an error of the semiconductor device 100, due to a leakage current increasing according to a temperature variation.

At a test level of the semiconductor device 100, a level of the leakage current may be measured at a temperature of 25° C. A body bias voltage V1 at this time may have a value allowing a minimum leakage current at 25° C. However, if the semiconductor device 100 is driven at a mounting environment, a driving temperature may rise to a higher temperature. The semiconductor device 100 of the exemplary embodiments may be configured to detect a driving temperature at a mounting environment. The semiconductor device 100 of the exemplary embodiments may adaptively adjust a body bias voltage at which a minimum leakage current flows at a detected driving temperature.

Figure 5:
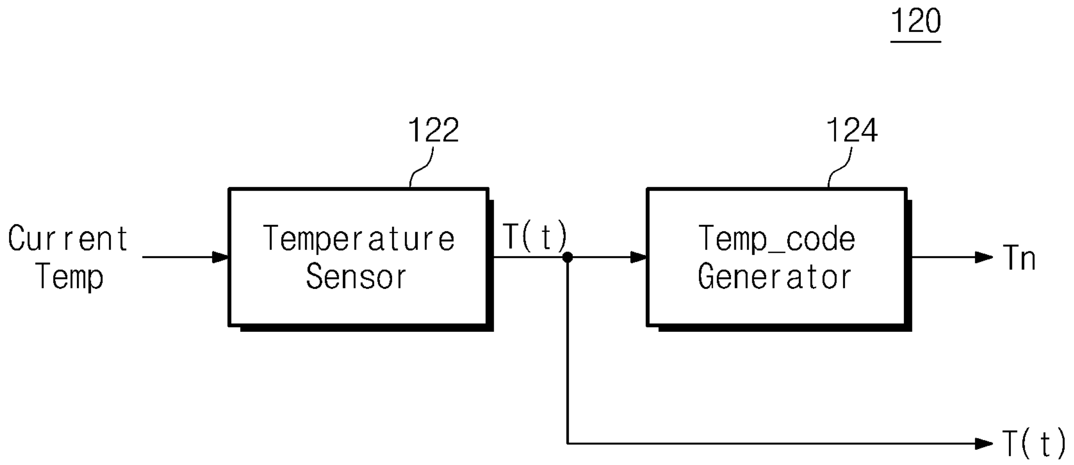
FIG. 5 is a block diagram schematically illustrating a temperature detector according to an embodiment.

FIG. 5 is a block diagram schematically illustrating a temperature detector according to an embodiment. Referring to FIG. 5, a temperature detector 120 may include a temperature sensor 122 and a temperature code generator 124.

The temperature sensor 122 may sense a current temperature. The semiconductor-based temperature sensor 122 may use temperature dependency of a resistor or a temperature dependency of a junction voltage. The temperature sensor 122 may output an electric signal type of temperature signal T(t), which has a level corresponding to a current temperature.

The temperature code generator 124 may code an analog signal T(t), corresponding to the sensed current temperature, to digital information. A semiconductor device 100 performing a digital operation may recognize a temperature as binary data. A binary data type of temperature code Tn may be necessary to perform various operations for comparing or processing temperature information. Thus, the temperature code generator 124 may code the analog signal T(t) to a binary temperature code Tn.

The temperature detector 120 may provide the temperature signal T(t) or the temperature code Tn, according to a manner where an adaptive body bias generator 130 is implemented. If the adaptive body bias generator 130 generates a body bias voltage Vbb in an analog manner, the temperature detector 120 may provide the temperature signal T(t). If the adaptive body bias generator 130 generates the body bias voltage Vbb in a digital manner, the temperature detector 120 may provide the temperature code Tn.

Figure 6:
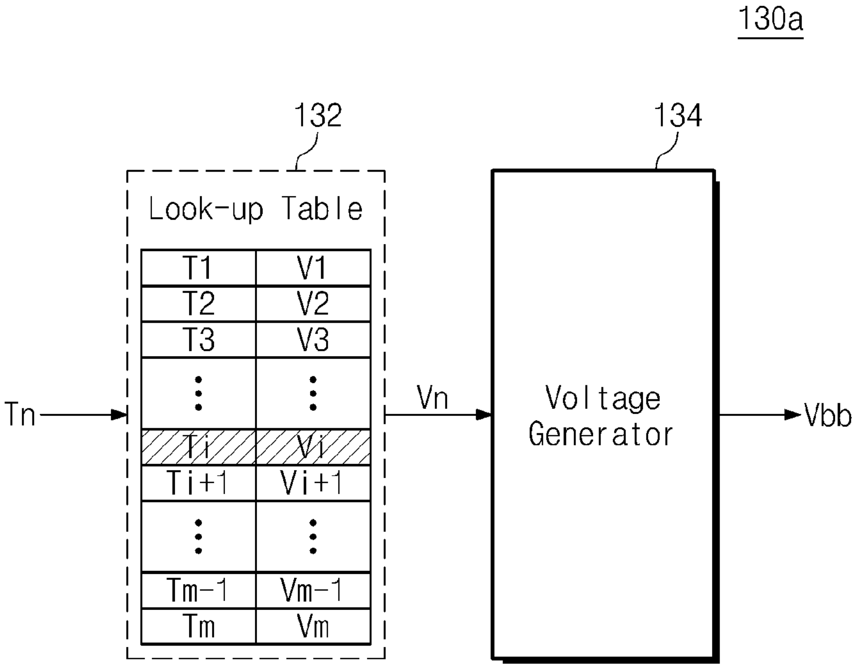
FIG. 6 is a block diagram schematically illustrating an adaptive body bias generator according to an embodiment.

FIG. 6 is a block diagram schematically illustrating an adaptive body bias generator, according to an embodiment. Referring to FIG. 6, an adaptive body bias generator 130*a* may include a look-up table 132 and a voltage generator 134.

The look-up table 132 may provide a body bias voltage corresponding to a temperature code Tn. For example, in the event that a temperature code provided from a temperature detector 120 is T2, mapping information on a body bias voltage V2 optimized to T2 may be stored at the look-up table 132. Although a temperature code Tn corresponding to a particular temperature is input, the look-up table 132 may transfer a voltage code Vn corresponding to the input temperature code Tn to the voltage generator 134.

The voltage generator 134 may generate a body bias voltage Vbb corresponding to a voltage code Vn provided from the look-up table 132. The voltage generator 134 may selectively generate various levels of body bias voltages Vbb, in response to the voltage code Vn. For example, the voltage generator 134 may be formed of a voltage divider controlled by the voltage code Vn.

As illustrated in FIG. 4, the body bias voltage Vbb, provided according to a temperature code Tn, may be a voltage adjusted such that a minimum leakage current flows. Thus, a semiconductor device 100 of the exemplary embodiments may provide a body bias adaptively to a temperature variation using the adaptive body bias generator 130*a*.

Figure 7:
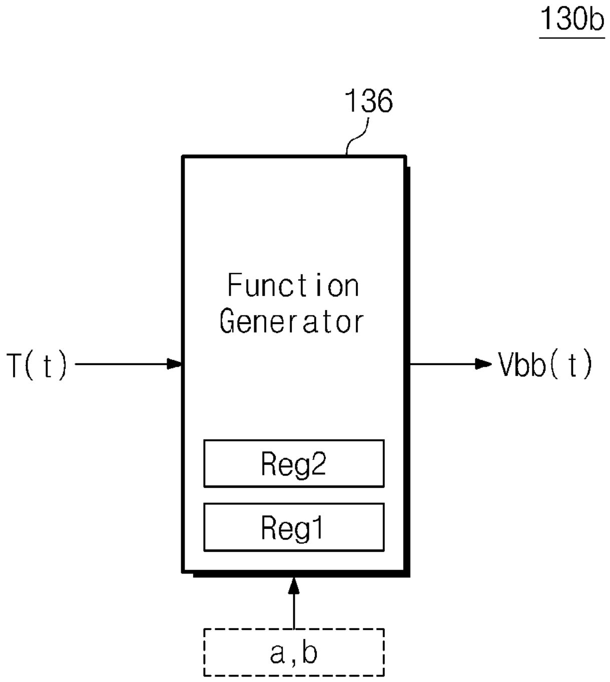
FIG. 7 is a block diagram schematically illustrating an adaptive body bias generator according to another embodiment.

FIG. 7 is a block diagram schematically illustrating an adaptive body bias generator according to another embodiment. Referring to FIG. 7, an adaptive body bias generator 130*b* may receive an analog type of temperature signal T(t) to generate an analog type of body bias voltage Vbb(t). The adaptive body bias generator 130*b* may include a function generator 136.

The function generator 136 may be formed of a function circuit for generating a body bias voltage Vbb(t) corresponding to an input temperature signal T(t). For example, the function generator 136 may be implemented by a linear function featuring a constant slope and an intercept of a body bias voltage Vbb(t) on an input temperature signal T(t). As described with reference to a graph of FIG. 4, an optimum body bias voltage Vbb may have approximate linearity with respect to a temperature. For example, the function generator 136 may be implemented by passive elements having a linear function type of input/output characteristic. Thus, the function generator may be easy to implement.

The function generator 136 may include registers Reg1 and Reg2 which store constants a and b for implementing a function of an optimal body bias voltage Vbb(t) according to a temperature. A temperature signal T(t) currently received is a variable changed according to a time, but the constants a and b corresponding to a slope and an intercept may have inherent values, according to processing errors of semiconductor devices. The constants a and b may be measured and decided at a test level to be provided as initial data. Alternatively, the constants a and b may be decided to be numerical values selected through a test process as optimum values.

In a case of implementing a body bias voltage Vbb(t) output in a simply linear function type with respect to the temperature signal T(t), a body bias generator having a high-speed response characteristic may be implemented using a simple structure. In addition, a quantization error, according to discrete coding on the temperature signal T(t) as an analog signal, may be reduced, such that the body bias generator 130*b* has a high degree of accuracy.

Figures 8, 9:
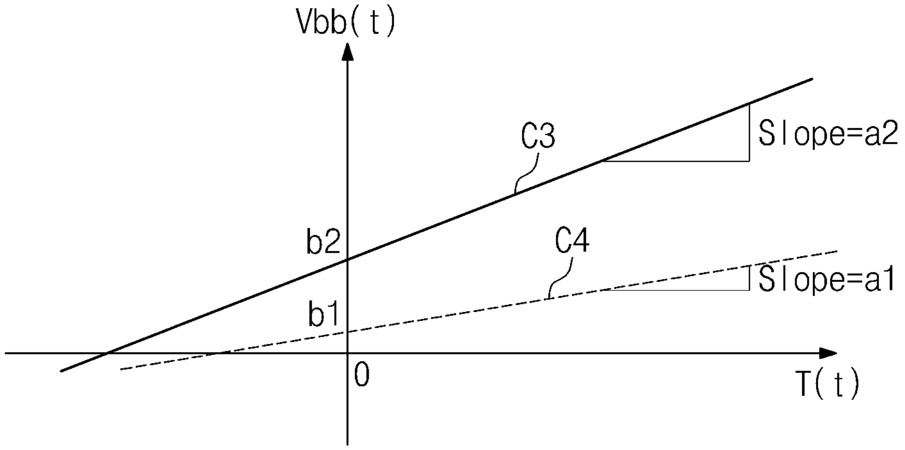
FIG. 8 is a diagram schematically illustrating an input/output characteristic of a function generator of FIG. 7.
FIG. 9 is a table schematically illustrating a method of setting constants of a function generator according to an embodiment.

FIG. 8 is a diagram schematically illustrating an input/output characteristic of a function generator of FIG. 7. Referring to FIG. 8, a function generator 136 (refer to FIG. 7) may show a body voltage characteristic of a PMOS transistor having different process parameters.

A linear function shown in a curve C3 may show an input/output characteristic of the function generator 136 set to constants a2 and b2. The function generator 136 set to constants a2 and b2 may generate a body bias voltage Vbb(t) which linearly increases according to an increase in a temperature by a linear function having a slope of a2 and an intercept of b2. Referring to a curve C3, a body bias voltage b2 may be provided to a body of a PMOS transistor at a time when a temperature is 0° C. As a temperature rises, the function generator 136 may generate the body bias voltage Vbb(t) which increases along a constant slope of a2.

The curve C4 may show an input/output characteristic of the function generator 136 set to constants a1 and b1. The function generator 136, set to constants a1 and b1, may generate a body bias voltage Vbb(t) which linearly increases according to an increase in a temperature by a linear function having a slope of a1 and an intercept of b1. Referring to a curve C4, a body bias voltage b1 may be provided to a body of a PMOS transistor at a time when a temperature is 0° C. A voltage b1 may be lower than a voltage b2. This characteristic may mean a difference between leakage currents which are variously generated according to a process error of a PMOS transistor. As a temperature rises, the function generator 136 may generate the body bias voltage Vbb(t) which increases along a constant slope of a1. The curve C4, whose slope is less than that of the curve C3, may mean that a variation in a leakage current on a temperature variation is less compared with a semiconductor device corresponding to the curve C3.

There is described an example where a body bias voltage of the function generator 136 is generated in consideration of a difference, such as a process error. Although a body bias voltage on a temperature of a PMOS transistor is exemplarily described, the exemplary embodiments may be applied the same as an NMOS transistor. In a case of the NMOS transistor, there may output a body bias voltage Vbb(t) being a negative voltage, whose absolute value becomes larger, according to an increase in a temperature.

FIG. 9 is a table schematically illustrating a method of setting constants of a function generator according to an embodiment. Referring to FIG. 9, a semiconductor device 100 may be divided into, e.g., five groups according to leakage currents of transistors. If a leakage current of an NMOS transistor and a leakage current of a PMOS transistor are marked by continuous alphabets, semiconductor chips may be divided into SS, SF, NN, FS, and FF groups according to leakage currents of transistors. The SS group may indicate a case that leakage currents of NMOS and PMOS transistors are minimal. The SF group may indicate a case that a leakage current of an NMOS transistor is minimal and a leakage current of a PMOS transistor is maximal. The NN group may indicate a case that leakage currents of NMOS and PMOS transistors are intermediate. The FS group may indicate a case that a leakage current of an NMOS transistor is maximal and a leakage current of a PMOS transistor is minimal. The FF group may indicate a case that leakage currents of NMOS and PMOS transistors are maximal.

When semiconductor chips are classified based on a level of a leakage current IDS, the yield of production may be improved using an adaptive control manner of a body bias voltage according to a temperature. If an adaptive body bias control technique according to a temperature is applied to a chip not being a good chip, a normal operation may be possible. Thus, it is possible to reduce a failure rate due to a difference between process parameters.

Different constants may be allotted to NMOS and PMOS transistors to adjust a body bias adaptively. For example, it is assumed that (a1, b1) is allocated as constants for generating a body bias voltage Vbb(t) of a PMOS transistor in the SS group. In this case, (−a1, −b1) may be provided as constants stored at a function generator 136 to generate a body bias voltage Vbb(t) of a PMOS transistor in the SS group. As a result, a body bias voltage Vbbn(t) provided to an NMOS transistor, in the same group, may be implemented by a symmetric function on a temperature axis T(t) of a body bias voltage Vbbp(t) of a PMOS transistor. The above-described function setting method may be applied to the SS, SF, NN, FS, and FF groups. However, the exemplary embodiments are not limited thereto. Optimized functions of semiconductor devices may be implemented through various offsets and approximation.

Figures 10, 11:
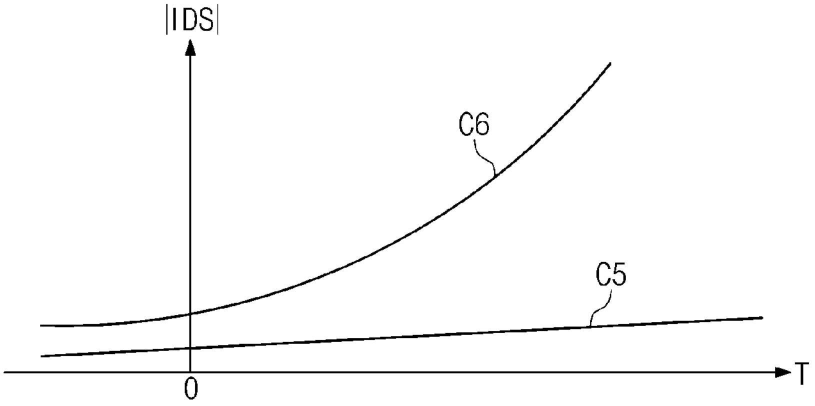
FIG. 10 is a table schematically illustrating a leakage current and a leakage percentage based on a temperature and a body bias voltage.
FIG. 11 is a graph illustrating an effect according to a body bias voltage.

FIG. 10 is a table schematically illustrating a leakage current and a leakage percentage based on a temperature and a body bias voltage. Referring to FIG. 10, the leakage percentage is highest when the temperature is at 25° C. and the body bias voltage is 1.1V (e.g., 100% leakage current). In contrast, at 85° C., when the body bias voltage detected by the temperature detector 120 is 1.6V, the leakage percentage is only at 44%.

FIG. 11 is a graph illustrating an effect according to a body bias voltage of the exemplary embodiments. Referring to FIG. 11, a variation in a leakage current IDS, according to a temperature, may be slightly reduced by providing a body bias voltage according to an embodiment.

A curve C5 may show a variation in a static leakage current IDS of a semiconductor device providing an optimal body bias voltage according to a temperature. An increase in leakage current due to an increase in a temperature may be inevitable. However, an increasing level of the leakage current IDS may be reduced by adjusting a body bias voltage to have an optimized level. A curve C6 may show a case that a body bias voltage is not adjusted according to a variation in a temperature. In this case, a static leakage current IDS may be varied sharply according to an increase in a temperature.

With the exemplary embodiments where a body bias voltage is controlled according to a temperature, an optimal body bias voltage may be provided to a transistor body at all temperatures where a semiconductor device is driven. Thus, it is possible to minimize an increase in a leakage current IDS due to a variation in a driving temperature. Power consumption of the semiconductor device may be reduced by lowering a leakage current IDS. Thus, an abnormal operation due to the leakage current IDS is prevented.

Figure 12:
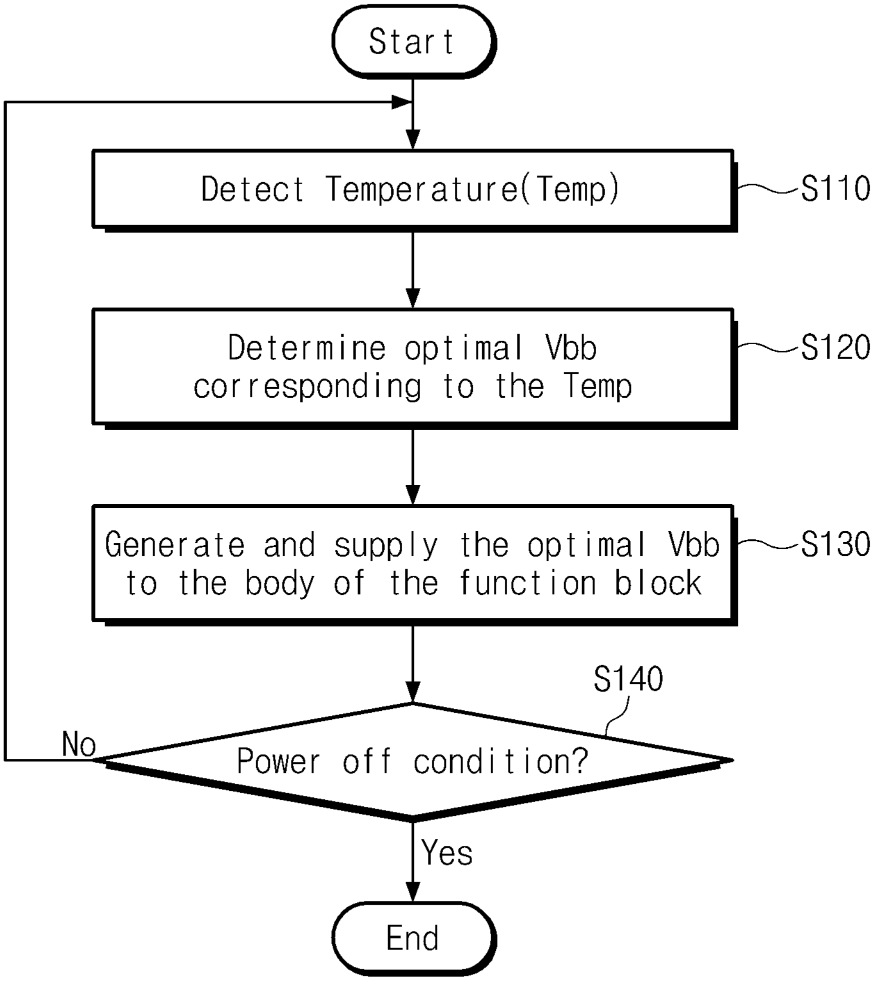
FIG. 12 is a flow chart schematically illustrating a body bias method according to an embodiment.

FIG. 12 is a flow chart schematically illustrating a body bias method according to an embodiment. Referring to FIG. 12, an adaptive body bias generator 130 (refer to FIG. 1) may provide a body bias voltage such that a leakage current is minimized at a current temperature of a semiconductor device 100.

In operation S110, a temperature detector 120 may detect an internal driving temperature Temp of the semiconductor device 100. The adaptive body bias generator 130 may determine the internal driving temperature Temp of the semiconductor device 100 based on a real-time driving temperature provided from the temperature detector 120. Thee internal driving temperature Temp may be provided using a binary temperature code Tn or an analog type of temperature signal T(t).

In operation S120, the adaptive body bias generator 130 may decide a body bias voltage Vbb (Vbb) optimized to the current temperature based on temperature information provided from the temperature detector 120. At this time, the adaptive body bias generator 130 may decide a body bias voltage for setting process parameters of NMOS and PMOS transistors and a minimum leakage current at a current driving temperature.

The adaptive body bias generator 130 may generate a body bias voltage using a manner described in FIG. 6 or 7. In the event that temperature information is provided using the binary temperature code Tn, the adaptive body bias generator 130 may generate a body bias using a scanning operation (e.g., a look-up table manner). On the other hand, if temperature information is provided using an analog type of temperature signal T(t), a body bias voltage Vbb(t) corresponding to a temperature may be provided in a continuous function form. The continuous function may have various forms, and may be modeled to a linear function so that implementation is easier.

In operation S130, the adaptive body bias generator 130 may generate the decided body bias voltage Vbb and provide the body bias voltage Vbb to the function block 110. Optimized body voltages capable of minimizing a leakage current may be applied to bodies of PMOS and NMOS transistors of the function block 110.

In operation S140, the adaptive body bias generator 130 may determine whether to continue to sense a temperature in real time or whether to stop controlling a body bias voltage. In case of an end mode where a power of the semiconductor device 100 is off, the adaptive body bias generator 130 may terminate the overall operation. On the other hand, in the event that a power continues to be supplied and the semiconductor device 100 operates normally, the method may proceed to operation S110 to continue to measure a temperature.

Figure 13:
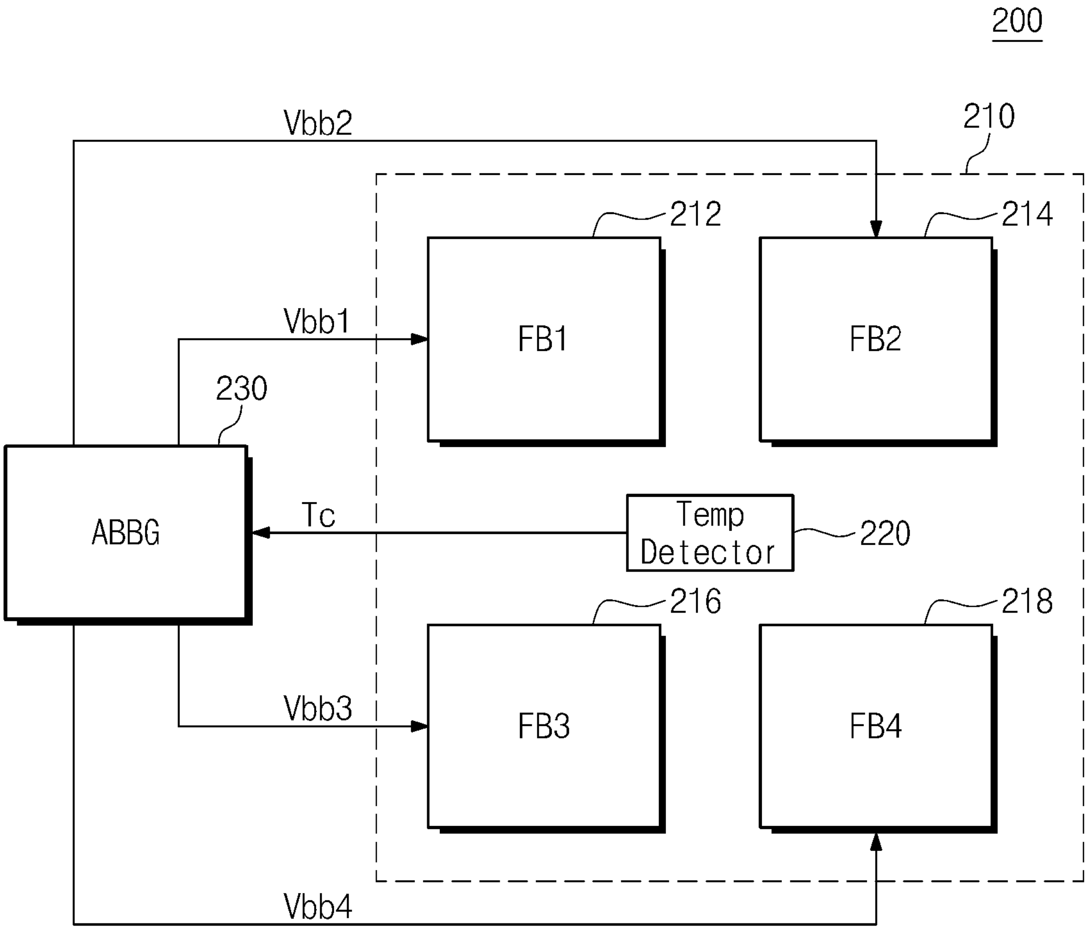
FIG. 13 is a block diagram schematically illustrating a semiconductor device according to another embodiment.

FIG. 13 is a block diagram schematically illustrating a semiconductor device according to another embodiment. Referring to FIG. 13, a semiconductor device 200 may include a function block group 210, a temperature sensor 220, and an adaptive body bias generator 230. The function block group 210 may include a plurality of function blocks 212, 214, 216, and 218, which are independently supplied with body voltages Vbb1, Vbb2, Vbb3, and Vbb4.

The function block group 210 of the exemplary embodiments may include the function blocks 212, 214, 216, and 218. Each of the function blocks 212, 214, 216, and 218, for example, may correspond to an intellectual property unit. Alternatively, each of the function blocks 212, 214, 216, and 218 may be implemented by a function block which is larger or smaller in size than an intellectual property of a system on chip. Since functions of the function blocks 212, 214, 216, and 218 in the semiconductor device 200 are different, their driving frequencies, driving speeds, and driving voltages may be different from one another. In this case, a leakage current may be controlled by providing different body bias voltages to the function blocks 212, 214, 216, and 218.

The temperature sensor 220 may be mounted at a particular location of the function block group 210 to sense a temperature corresponding to the particular location. The temperature sensor 220 may provide a sensed temperature Tc to the adaptive body bias generator 230.

The adaptive body bias generator 230 may generate body bias voltages, optimized to the function blocks 212, 214, 216, and 218, based on temperature information from the temperature sensor 220. Body bias voltages Vbb1, Vbb2, Vbb3, and Vbb4 generated by the adaptive body bias generator 230 may be provided to corresponding function blocks.

Although function blocks are included in the same chip and operate at the same temperature, levels of leakage currents may be different according to a driving frequency, a driving voltage, and a frequency of a driving clock. The adaptive body bias generator 230 may provide different body bias voltages to the function blocks 212, 214, 216, and 218 in consideration of their driving characteristics.

As described above, the semiconductor device 200 may provide different body bias voltages to the function blocks 212, 214, 216, and 218 having different driving characteristics. In example embodiments, at least two body bias voltages can have the same level according to characteristics of function blocks.

Figure 14:
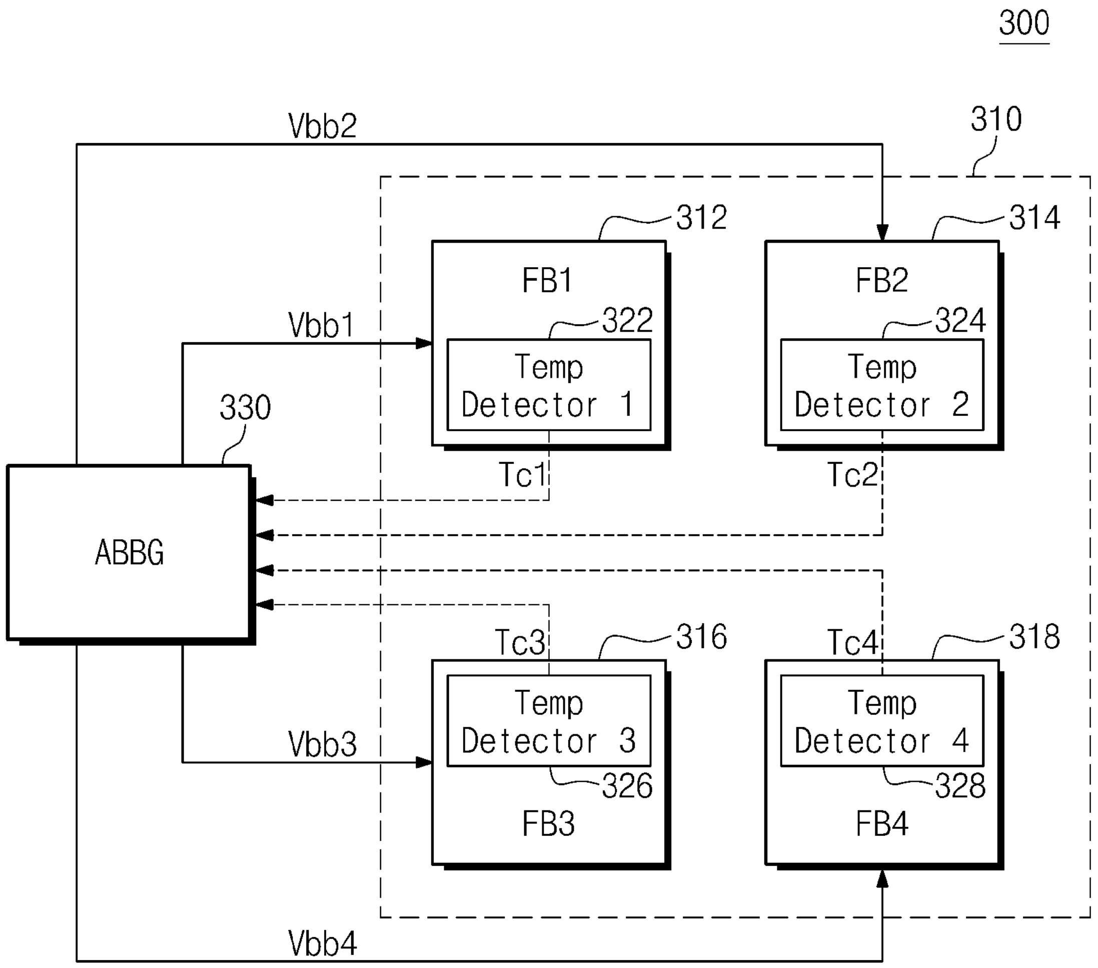
FIG. 14 is a block diagram schematically illustrating a semiconductor device according to still another embodiment.

FIG. 14 is a block diagram schematically illustrating a semiconductor device according to still another embodiment. Referring to FIG. 14, a semiconductor device 300 may include a function block group 310, a plurality of temperature sensors 322, 324, 326, and 328, and an adaptive body bias generator 330. The function block group 310 may include a plurality of function blocks 312, 314, 316, and 318, which are supplied with independent body voltages Vbb1, Vbb2, Vbb3, and Vbb4.

The function block group 310 of the exemplary embodiments may include the function blocks 312, 314, 316, and 318. Each of the function blocks 312, 314, 316, and 318, e.g., may correspond to an intellectual property unit. Alternatively, each of the function blocks 312, 314, 316, and 318 may be implemented by a function block which is larger or smaller in size than an intellectual property of a system on chip. Since functions of the function blocks 312, 314, 316, and 318 in the semiconductor device 300 are different, their driving frequencies, driving speeds, and driving voltages may be different from one another. In this case, a leakage current may be controlled by providing different body bias voltages to the function blocks 312, 314, 316, and 318.

The temperature sensors 322, 324, 326, and 328 may be respectively included in the function blocks 312, 314, 316, and 318 of the function block group 310. The first temperature sensor 322 may be included in the first function block 312, the second temperature sensor 324 may be included in the second function block 314, the third temperature sensor 326 may be included in the third function block 316, and the fourth sensor 328 may be included in the fourth function block 318. The temperature sensors 322, 324, 326, and 328 may sense current temperatures Tc1, Tc2, Tc3, and Tc4, and provide them to the adaptive body bias generator 330 in real time.

The adaptive body bias generator 330 may generate body bias voltages, optimized to the function blocks 312, 314, 316, and 318, based on temperature information from the temperature sensors 322, 324, 326, and 328. Body bias voltages Vbb1, Vbb2, Vbb3, and Vbb4 generated by the adaptive body bias generator 330 may be provided to corresponding function blocks.

Driving temperatures of function blocks may vary according to a level of a power supply voltage, a frequency of a driving clock, etc. For example, in the event that the semiconductor device 300 is a multi-core type application processor, a temperature of a core performing a main arithmetic operation may be different from that of a core performing an auxiliary arithmetic operation. In the event that body bias voltages are independently provided according temperatures of cores, a leakage current may be effectively controlled and power consumption may be reduced.

Figure 15:
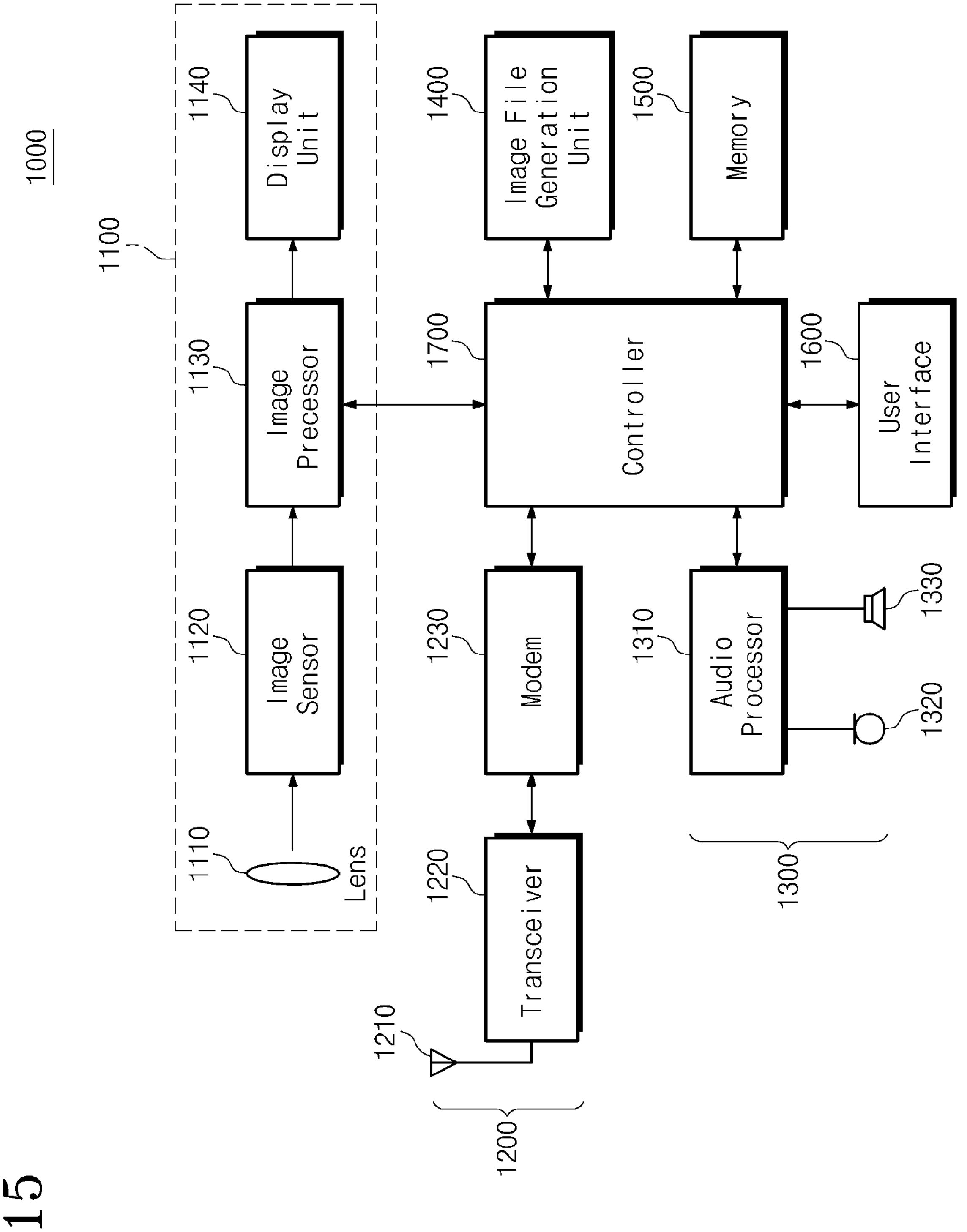
FIG. 15 is a block diagram schematically illustrating a handheld terminal including a semiconductor device according to an embodiment.

FIG. 15 is a block diagram schematically illustrating a handheld terminal including a semiconductor device according to an embodiment of the inventive concept. Referring to FIG. 15, a handheld terminal 1000 may include an image processing block 1100, a wireless transceiver block 1200, an audio processing block 1300, an image file generation unit 1400, a memory 1500, a user interface 1600, and a controller 1700.

The image processing block 1100 may include an image sensor 1120, an image processor 1130, and a display unit 1140. The wireless transceiver block 1200 may include an antenna 1210, a transceiver 1220, and a modem 1230. The audio processing block 1300 may include an audio processor 1310, a microphone 1320, and a speaker 1330.

The handheld terminal 1000 may include various types of semiconductor devices. An application processor performing a function of the controller 1700 may require low power and high performance. The controller 1700 may have a multi-core structure according a scaled down process. If a body bias method of the exemplary embodiments is employed, the amount of leakage current generated at the controller 1700 may be reduced. As the leakage current is reduced, it is possible to reduce power consumption of the controller 1700 and to lower an increase in a temperature.

Herein, there is described an example in which the body bias method of the exemplary embodiments is applied to the controller 1700. However, the exemplary embodiments are not limited thereto. For example, a manner of controlling a body bias according to a temperature is applicable to chips included in the image processing block 1100, the wireless transceiver block 1200, the audio processing block 1300, and the image file generation unit 1400, etc.

Figure 16:
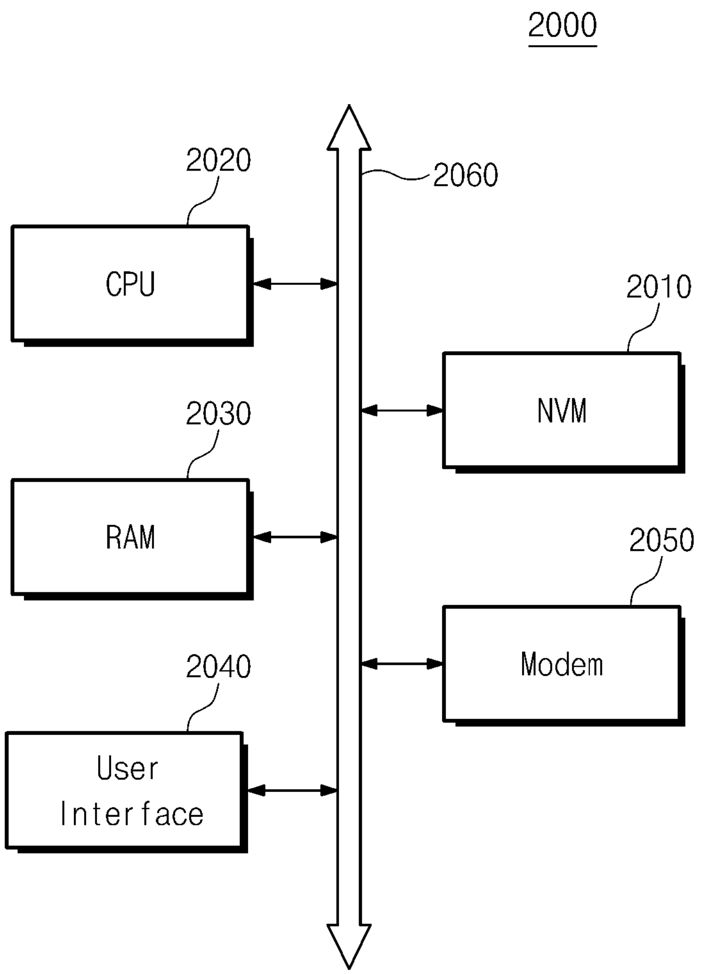
FIG. 16 is a block diagram illustrating a computing system performing a body bias method according to an embodiment.

FIG. 16 is a block diagram illustrating a computing system performing a body bias method according to an embodiment. A computing system 2000 may include a nonvolatile memory device 2010, a CPU 2020, a RAM 2030, a user interface 2040, and a modem 2050 such as a baseband chipset, which are electrically connected with a system bus 2060.

If the computing system 2000 is a mobile device, it may further include a battery (not shown) which powers the computing system 2000. Although not shown in FIG. 16, the computing system 2000 may further include an application chipset, a camera image processor (CIS), a mobile DRAM, etc.

A method of controlling a body bias according to a temperature may be applied to components such as the nonvolatile memory device 2010, the CPU 2020, the RAM 2030, the user interface 2040, and the modem 2050

A semiconductor device may be packed by one selected from various types of packages such as PoP (Package on Package), Ball grid arrays (BGAs), Chip scale packages (CSPs), Plastic Leaded Chip Carrier (PLCC), Plastic Dual In-Line Package (PDIP), Die in Waffle Pack, Die in Wafer Form, Chip On Board (COB), Ceramic Dual In-Line Package (CERDIP), Plastic Metric Quad Flat Pack (MQFP), Thin Quad Flatpack (TQFP), Small Outline (SOIC), Shrink Small Outline Package (SSOP), Thin Small Outline (TSOP), System In Package (SIP), Multi Chip Package (MCP), Wafer-level Fabricated Package (WFP), Wafer-Level Processed Stack Package (WSP), etc.

While the exemplary embodiments have been described, it will be apparent to those skilled in the art that various changes and modifications may be made without departing from the spirit and scope of the exemplary embodiments. Therefore, it should be understood that the above embodiments are not limiting, but illustrative.

What is claimed is:

1. A semiconductor device, comprising:
- a function block comprising a plurality of transistors;
- a temperature detector configured to detect a driving temperature of the function block in real time; and
- an adaptive body bias generator configured to provide a body bias voltage to adaptively adjust leakage currents of the transistors according to the detected driving temperature,
- wherein the adaptive body bias generator is further configured to generate the body bias voltage corresponding to a predetermined minimum leakage current according to the driving temperature.

2. The semiconductor device of claim 1, wherein the adaptive body bias generator is further configured to store level information of the body bias voltage which corresponds to the driving temperature, such that the predetermined minimum leakage current is minimized.

3. The semiconductor device of claim 1, wherein the temperature detector is further configured to sense the driving temperature and output a temperature code of binary data as a result of the sensing, and wherein
- the adaptive body bias generator comprises:
- a look-up table configured to provide a level code of the body bias voltage corresponding to the temperature code; and
- a voltage generator configured to generate the body bias voltage according to the level code provided from the look-up table.

4. The semiconductor device of claim 1, wherein the temperature detector is further configured to sense the driving temperature to provide an analog type of a temperature signal.

5. The semiconductor device of claim 4, wherein the adaptive body bias generator comprises:
- a function generator configured to generate a continuous function type of the body bias voltage based on the temperature signal.

6. The semiconductor device of claim 5, wherein the function generator is further configured to generate the body bias voltage according to the temperature signal, and the body bias voltage is generated based on a continuous linear function on the temperature signal.

7. The semiconductor device of claim 6, wherein the function generator comprises a register for setting a slope and an intercept of the continuous linear function.

8. The semiconductor device of claim 7, wherein the slope or the intercept is set according to process parameters of the transistors.

9. A body bias method of a semiconductor device, comprising:
- detecting a driving temperature of the semiconductor device;
- generating a body bias voltage for adjusting leakage currents of a plurality of transistors included in the semiconductor device at the driving temperature; and
- providing the body bias voltage to the transistors of the semiconductor device.

10. The body bias method of claim 9, wherein upon detecting the driving temperature of the semiconductor device, the driving temperature is provided using an analog type of a temperature signal.

11. The body bias method of claim 10, wherein during generating the body bias voltage, the body bias voltage is generated as a continuous linear function based on the temperature signal.

12. The body bias method of claim 11, wherein an intercept and a slope of the continuous linear function are set according to process characteristics of the semiconductor device.

13. The body bias method of claim 9, wherein during detecting the driving temperature of the semiconductor device, the driving temperature is provided using a digital type of a temperature code.

14. The body bias method of claim 13, wherein the generating the body bias voltage comprises:
- generating a level code corresponding to the temperature code; and
- generating the body bias voltage according to the level code.

15. The body bias method of claim 14, wherein the level code corresponding to the temperature code is provided from a look-up table.

16. The body bias method of claim 9, wherein the body bias voltage has level information which corresponds to the driving temperature, such that the leakage currents of the transistors are minimized.

17. A system on chip, comprising:

a plurality of function blocks;

a temperature detector configured to detect a respective driving temperature of each of the function blocks in real time; and a body bias generator configured to generate a respective body bias voltage to adaptively adjust leakage currents of each of the function blocks according to the respective driving temperature.

18. The system on chip of claim 17, wherein the body bias generator is further configured to generate the respective body bias voltage having a predetermined level according to the respective driving temperature of each of the function blocks.

19. The system on chip of claim 18, wherein the temperature detector comprises:

a plurality of temperature sensors configured to sense a plurality of respective temperatures of the function blocks.

20. The system on chip of claim 19, wherein the body bias generator is further configured to generate a plurality of body bias voltages which have different levels, according to the respective driving temperatures of each of the function blocks.

21. The system on chip of claim 18, wherein the respective body bias voltage having the predetermined level during a test enables the leakage currents to be minimized at the respective driving temperature.

22. The system on chip of claim 17, wherein the leakage currents correspond to a static leakage current flowing in a drain terminal of a transistor included in each of the function blocks.

23. The system on chip of claim 17, wherein the temperature detector configured to detect the respective driving temperature of each of the function blocks comprises at least one temperature sensor.

24. A function block comprising:

at least one NMOS transistor configured to receive a NMOS bias voltage from an adaptive body bias generator;

at least one PMOS transistor configured to receive a PMOS bias voltage from the adaptive body bias generator; and a temperature detector configured to detect a driving temperature of the function block in real time and provide the detected driving temperature to the adaptive body bias generator.

25. The function block of claim 24, wherein the function block, the adaptive body bias generator, the at least one NMOS transistor, and the at least one PMOS transistor are provided with a driving voltage.

26. The function block of claim 24, wherein the adaptive body bias generator comprises a look-up table and a voltage generator for converting the detected driving temperature to a body bias voltage.

27. The function block of claim 24, wherein the adaptive body bias generator comprises a function generator for converting the detected driving temperature to a body bias voltage.

* * * * *